United States Patent
D'Abreu

(10) Patent No.: US 9,286,989 B2
(45) Date of Patent: Mar. 15, 2016

(54) PARTIAL BLOCK ERASE FOR A THREE DIMENSIONAL (3D) MEMORY

(71) Applicant: SANDISK TECHNOLOGIES INC., Plano, TX (US)

(72) Inventor: Manuel Antonio D'Abreu, El Dorado Hills, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/676,670

(22) Filed: Apr. 1, 2015

(65) Prior Publication Data

US 2015/0364198 A1 Dec. 17, 2015

Related U.S. Application Data

(62) Division of application No. 14/304,419, filed on Jun. 13, 2014, now Pat. No. 9,036,428.

(51) Int. Cl.
| | | |
|---|---|---|
| *G11C 11/34* | (2006.01) | |
| *G11C 16/04* | (2006.01) | |
| *G11C 16/14* | (2006.01) | |

(52) U.S. Cl.
CPC ............ *G11C 16/14* (2013.01); *G11C 16/0483* (2013.01)

(58) Field of Classification Search
CPC .... G11C 16/0483; G11C 16/10; G11C 16/26; G11C 16/08; G11C 16/16; G11C 16/24; G11C 7/00; G11C 8/08
See application file for complete search history.

(56) References Cited

U.S. PATENT DOCUMENTS

| | | | |
|---|---|---|---|
| 7,193,897 B2 | 3/2007 | Lee | |
| 7,480,176 B2 | 1/2009 | Kamei | |
| 7,518,923 B2 | 4/2009 | Mokhlesi | |
| 7,542,353 B2 | 6/2009 | Park | |
| 7,551,492 B2 | 6/2009 | Kim | |
| 7,804,718 B2 | 9/2010 | Kim | |
| 8,467,246 B2 * | 6/2013 | Kim ................... | G11C 16/0483 365/185.09 |
| 8,634,246 B2 * | 1/2014 | Kang .................... | G11C 16/16 365/185.17 |
| 2006/0256623 A1 | 11/2006 | Roohparvar | |
| 2008/0195804 A1 | 8/2008 | Kim et al. | |
| 2010/0103733 A1 | 4/2010 | Hemink | |
| 2014/0036590 A1 | 2/2014 | Feeley et al. | |
| 2014/0063938 A1 | 3/2014 | Oh et al. | |

FOREIGN PATENT DOCUMENTS

JP 2012-069224 A 4/2012

OTHER PUBLICATIONS

Shah, Agam "Samsung's New 1TB SSD is Based on Latest 3D Technology," IT World, http://itworld.com/print/420770, May 28, 2014, 1 Page.

(Continued)

*Primary Examiner* — Hien Nguyen
(74) *Attorney, Agent, or Firm* — Toler Law Group, PC

(57) ABSTRACT

A method includes, at a non-volatile memory having a three dimensional (3D) memory configuration, performing an erase operation. Performing the erase operation includes providing a first control signal to isolate a first portion of a string of the non-volatile memory from a second portion of the string. Performing the erase operation further includes providing a first erase signal to erase the second portion of the string while data is maintained at the first portion of the string.

20 Claims, 6 Drawing Sheets

(56) References Cited

OTHER PUBLICATIONS

Notice of Allowance and Fees Due mailed Jan. 2, 2015 in U.S. Appl. No. 14/304,419, 9 pages.

Restriction Requirement mailed Sep. 4, 2014, in U.S. Appl. No. 14/304,419, 6 pages.

* cited by examiner

PARTIAL BLOCK ERASE FOR A THREE DIMENSIONAL (3D) MEMORY

CROSS-REFERENCE TO RELATED APPLICATIONS

The present application claims priority from U.S. application Ser. No. 14/304,419 filed Jun. 13, 2014, which is incorporated by reference herein in its entirety.

FIELD OF THE DISCLOSURE

The present disclosure is generally related to a partial block erase for a three dimensional (3D) memory.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

In non-volatile data storage devices having a three dimensional (3D) memory, erasing a block of the 3D memory may include time consuming and power expending processes. Additionally, when erasing the block, each wordline of the block is erased regardless of whether the wordline is already in an erased state and regardless of whether the wordline is approaching an end-of-life (e.g., failure) condition.

SUMMARY

Techniques are disclosed to perform a partial block erase for a three dimensional (3D) memory. For example, a data storage device may include a 3D memory having one or more blocks. Each block may include a plurality of sub-blocks that are erasable independently of the other sub-blocks of the block. For example, the block can include one or more switches to electrically isolate sub-blocks during an erase operation.

By performing an erase operation on a sub-block, rather than on an entire block, of the 3D memory, the erase operation may be performed more quickly and less power may be used. Additionally, by being able to perform erase operations on sub-blocks of the 3D memory, wordlines that have been identified as nearing an end-of-life condition may be selectively isolated from an erase operation that is performed on the rest of the block. By selectively isolating the wordlines that have been identified, a life of the wordlines may be extended.

DETAILED DESCRIPTION

Particular embodiments of the present disclosure are described with reference to the drawings. In the description, common features are designated by common reference numbers throughout the drawings.

Figure 1:
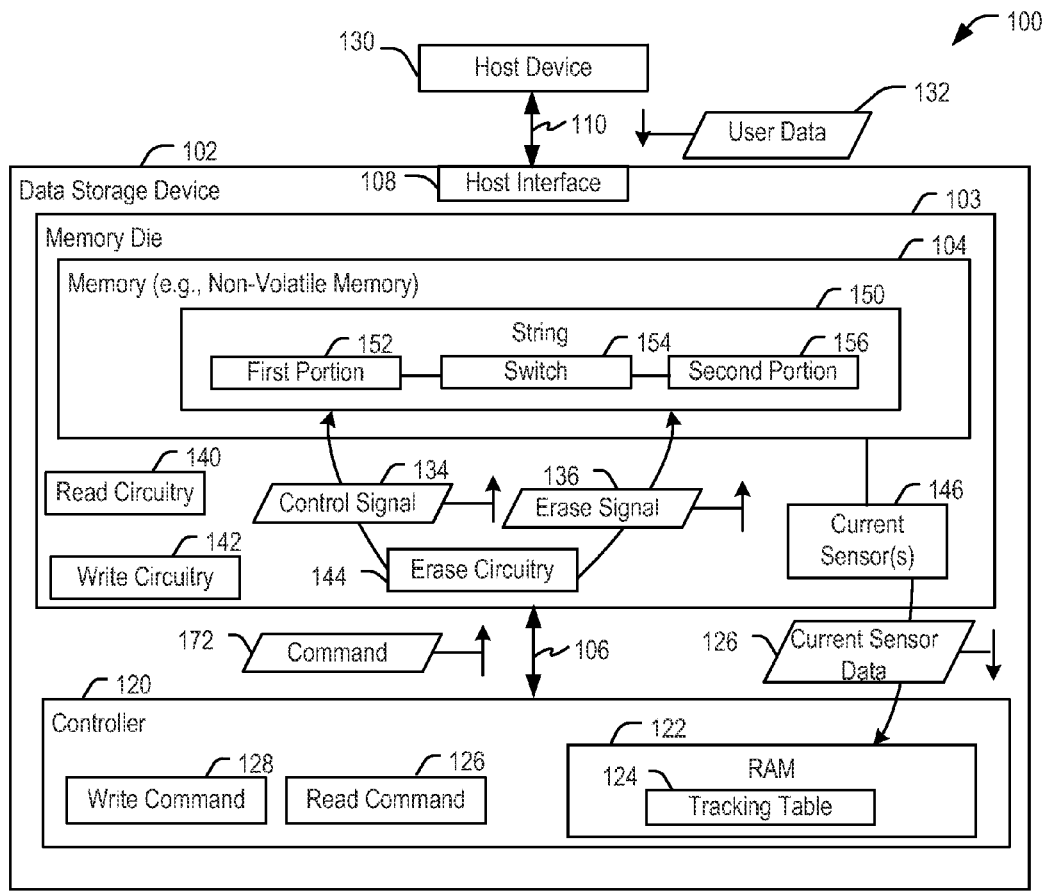
FIG. 1 is a block diagram of a particular illustrative embodiment of a system including a data storage device that includes a memory device that is configurable to perform a partial block erase.
Figure 1:
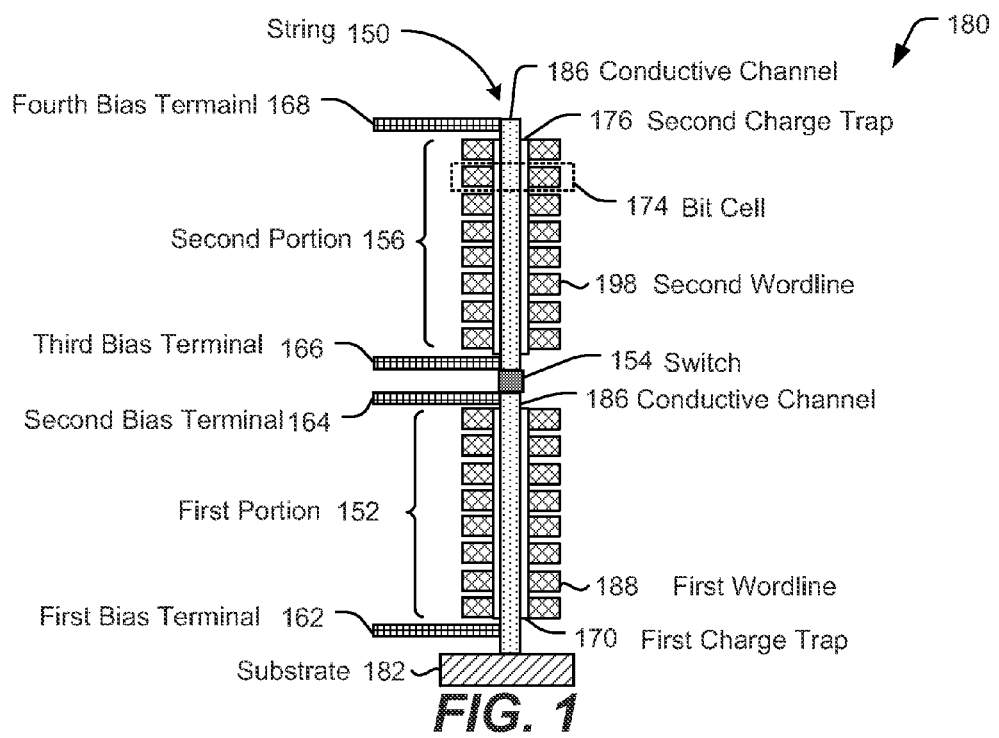

FIG. 1 is a block diagram of a particular illustrative embodiment of a system 100 including a data storage device 102 and a host device 130. The system 100 may be configured to enable the data storage device 102 to perform a partial block erase on a three dimensional (3D) memory.

The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The data storage device 102 may be coupled to the host device 130 via a communication path 110, such as a wired communication path and/or a wireless communication path. For example, the data storage device 102 may include an interface 108 (e.g., a host interface) that enables communication (via the communication path 110) between the data storage device 102 and the host device 130, such as when the interface 108 is coupled to the host device 130.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof The host device 130 may issue one or more commands to the data storage device 102, such as one or more requests to read data from or write data to a memory 104 of the data storage device 102. For example, the host device 130 may send data, such as user data 132 to be written to the memory 104 of the data storage device 102.

The data storage device 102 includes a controller 120 coupled to the memory 104, such as a non-volatile memory (e.g., a flash memory). The controller 120 may be coupled to the memory 104 via a bus 106, an interface, another structure, or a combination thereof The memory 104 has a three dimensional (3D) memory configuration, as described further herein. The memory 104 may store data, such as the user data 132.

The memory 104 may be included on a memory die 103 that is separate from the controller 120 and coupled to the controller 120 (e.g., via the bus 106). However, in other implementations, the memory 104 and the controller 120 may be included on a common die. The memory 104 may include multiple blocks that each includes a plurality of wordlines. The wordlines may be arranged in one or more layers. Each block may also include multiple "strings" of storage elements where the strings extend through the one or more layers, such as through each wordline. For example, the memory 104 may include a representative string 150, such as a vertical string (e.g., a NAND string). The string 150 may include a first portion 152 and a second portion 156. The string 150 may also include (or be coupled to) a switch 154 that may be configurable to couple or decouple the first portion 152 and the second portion 156. The switch 154 may be positioned (physically and/or electrically) between the first portion 152 and the second portion 156, such as between a first storage element of the first portion 512 and a second storage element of the second portion 156. For example, the switch 154 is configurable to selectively isolate the first portion 152 from the second portion 156. In addition, while two portions 152, 156 are shown in FIG. 1 and a single switch 154 is also shown, it should be understood that the string 150 may include more than two portions and more than one switch. Thus, the string 150 includes multiple portions that are selectively coupled or decoupled based on the switch 154. In some embodiments, the switch 154 may include a transistor, such as a metal-oxide semiconductor (MOS) transistor.

The memory die 103 may further include read circuitry 140, write circuitry 142, and erase circuitry 144. Although illustrated as separate components, the read circuitry 140, the write circuitry 142, the erase circuitry 144, and/or a combination thereof, may be included in a single component of the memory die 103. The read circuitry 140 and the write circuitry 142 may be configured to enable operations of reading data from the memory 104 and writing data to the memory 104, respectively.

The erase circuitry 144 may be configured to enable erase operations to be performed on the memory 104. For example, the erase circuitry 144 may be configured to enable block erase operations and/or partial block erase operations (e.g., sub-block erase operations), as described herein. To perform an erase operation, the erase circuitry 144 may send a control signal 134 and an erase signal 136 to the memory 104. The control signal 134 may cause one or more switches included in the memory 104 to operate (e.g., open and/or close). For example, the control signal 134 may cause the switch 154 to be in a closed position and couple the first portion 152 of the string 150 to the second portion 156 of the string 150. The erase signal 136 may cause one or more erase voltages to be applied to at least part of the memory 104 and to erase data stored in the memory 104. The data that is erased responsive to the erase signal 136 may depend on a configuration of the switch 154 and on portion of the memory 104 to which the erase voltage is applied.

To illustrate, during a first type of erase operation (e.g., a partial block erase operation), the first portion 152 may be isolated from the second portion 156 by the switch 154 being in an open state based on the control signal 134. With the first type of erase operation being performed, an erase voltage may be applied to the second portion 156 of the string 150 based on the erase signal 136. When the erase voltage is applied to the second portion 156 and the switch 154 is in the open state, data corresponding to the second portion 156 may be erased while data is maintained at the first portion 152 of the string 150. During a second type of erase operation, the first portion 152 may be coupled to the second portion 156 by the switch 154 being in a closed state. During a second erase operation corresponding to the second type of erase operation (e.g., a full block erase operation), the first portion 152 and the second portion 156 may be biased together at substantially the same voltage level. Although the first type of erase operation (e.g., the partial block erase operation) and the second type of erase operation (e.g., a full block erase operation) have been described with reference to a single string 150 of a block, it is understood that during each of the first type of erase operation and the second type of erase operation, each string of the block may be configured as described with reference to the string 150.

The memory 104 may also include one or more current sensors 146. The current sensors 146 may be coupled to the memory 104. For example, each current sensor (of the current sensors 146) may be coupled to a different wordline of a portion of the memory 104 that is being erased. Each current sensor may determine an amount of current through a corresponding wordline when an erase operation is performed that is associated with the corresponding wordline. For example, during a particular erase operation to erase a particular wordline, a particular current sensor, such as one of the current sensors 146 that corresponds to the particular wordline may determine an amount of current through the particular wordline. Based on the particular amount of current, an indication of the amount of current, such as the current sensor data 126, may be generated and provided to the controller 120. The current sensor data 126 may enable the controller 120 to determine a health status of the particular wordline, as described further herein.

An illustrative example of the string 150 is illustrated and generally designated 180. The example 180 depicts a cross-sectional elevation view of the string 150 having a vertical conducive channel structure extending through holes formed in a stack of wordlines to form a vertical column of storage elements. An example of a perspective view of a three dimensional (3D) memory is described with reference to FIGS. 5 and 6. The stack of wordlines may be associated with one or more physical layers (e.g., one or more physical levels).

The string 150 may be formed on a substrate 182, such as a silicon (Si) substrate. The string 150 may include a plurality of storage elements. Each storage element (e.g., a memory cell) of the string 150 may include a bit cell, such as a representative bit cell 174. The bit cell 174 may include (or be coupled to) a wordline, a portion of a charge trap, and a portion of a conductive channel. Each storage element (e.g., memory cell or bit cell) of the string 150 may be configured to store a data value, e.g., a bit value, such as "1" and "0," or a multi-bit value, such as in a two bit-per-cell (2-BPC) implementation, a three bit-per-cell (3-BPC) implementation, or another BPC implementation.

The string 150 may include the first portion 152 and the second portion 156. The first portion 152 may be associated with and/or correspond to a first set of storage elements (e.g., one or more storage elements) and the second portion 156 may be associated with and/or correspond to a second set of storage elements (e.g., one or more storage elements). The first portion 152 (e.g., the first set of wordlines) may correspond to a first sub-block of a block of the memory 104 that includes the string 150. The second portion 156 (e.g., the second set of wordlines) may correspond to a second sub-block of a block of the memory 104 that includes the string 150. The first set of storage elements and the second set of storage elements include the same number of storage elements or a different number of storage elements. In some embodiments, the first set of storage elements may include a single storage element, as an illustrative, non-limiting example.

The string 150 may include a conductive channel 186 (e.g., a vertical channel). The conductive channel 186 may be coupled the plurality of storage elements, such as the first set of storage elements and to the second set of storage elements. Each storage element of the plurality of storage elements may correspond to a different wordline. The first set of storage elements maybe included in a first group of (one or more) physical layers (e.g., a first physical level) and may correspond to a first set of wordlines including a representative first wordline 188. A first charge trap layer 170 may be positioned between the first set of wordlines and the conductive channel 186 (e.g., forming a sheath around the conductive channel 186). Although the first set of storage elements is illustrated as being above the substrate 182 with no intervening storage elements, another one or more other sets of storage elements may be between the substrate 182 and the first set of storage elements (e.g., another group of physical layers may be between the substrate 182 and the first group of physical layers).

The second group of storage elements may be included in a second group of (one or more) physical layers (e.g., a second physical level) and may correspond to a second set of wordlines including a representative second wordline 198. A second charge trap layer 176 may be positioned between the second set of wordlines and the second conductive channel 196. Although the first charge trap layer 170 and the second charge trap layer 176 are illustrate as separate layers, in other embodiments, the first charge trap layer 170 and the second charge trap layer 176 may be a single layer.

The switch 154 may be coupled to the string 150. For example, the switch may be coupled to the conductive channel 186. The switch 154 may be configurable to couple or decouple (e.g., electrically connect or electrically isolate) the first portion 152 of the string 150 to the second portion 156 of the string 150. To illustrate, the switch 154 may couple or may decouple the first portion 152 and the second portion 156 based on the control signal 134.

The string 150 (e.g., the conductive channel 186) may be coupled to a plurality of terminals. For example, the plurality of terminals include a first bias terminal 162, a second bias terminal 164, a third bias terminal 166, and a fourth bias terminal 168. In the illustrated embodiment, the first bias terminal 162 is located at a first end of the first portion 152 and the second bias terminal 164 is located at a second end of the first portion 152. The third bias terminal 166 is located a first end of the second portion 156 and the fourth bias terminal 168 is located at a second end of the second portion 156.

The plurality of terminals may be configured to enable an erase voltage to be applied to at least a part of the string 150 (e.g., at least part of the conductive channel 186) based on an erase signal, such as the erase signal 136. For example, when the first portion 152 is isolated from the second portion 156, a first erase operation may be performed on the second portion 156 of the string 150 to erase data at the second portion 156 while data is maintained at the first portion 152 of the string 150. To erase the data at the second portion 156, an erase voltage may be applied to the second portion 156 of the string 150 (e.g., to the third bias terminal 166 and/or the fourth bias terminal 168) and a particular voltage may be applied to each wordline of the second set of wordlines (e.g., the second sub-block). To illustrate, to erase the storage elements corresponding to the second portion 156 of the string 150, the particular voltage (applied to the second set of wordlines) may be associated with a first potential and the erase voltage may be associated with a second potential that is opposite of the first potential. For example, the first potential may be a positive voltage and the second potential may be a negative voltage or zero volts (e.g., a ground potential). A difference in the first potential and the second potential may erase a storage element (e.g., drain a charge that is stored at a charge trap of a bit cell).

The controller 120 is coupled to the memory 104 and is configured to determine whether to enable the switch 154 to couple the first portion 152 and the second portion 156 or to disable the switch 154 to decouple the first portion 152 from the second portion 156. For example, the controller 120 may include hardware and/or software, such as a processor (not shown) to execute firmware to determine whether to enable or disable the switch 154. The controller 120 may initiate different types of erase operations by sending a command 172 (e.g., an erase command) to the memory 104. In a first type of an erase operation, the first portion 152 is decoupled from the second portion 156 while in other types of erase operations the first portion 152 is coupled to the second portion 156 (so data within both the first portion 152 and the second portion 156 may be erased). Thus, the controller 120 may selectively erase one or more particular portions of the string 150.

The controller 120 may include a random access memory (RAM) 122. The RAM 122, such as a volatile memory, may be configured to store a tracking table 124. The tracking table 124 may store current sensor data, such as the current sensor data 126, received from the one or more current sensors 146. The controller 120 may collect current data (e.g., such as the current sensor data 126 indicating an amount of current sensed through a particular wordline during an erase operation), corresponding to the particular wordline, for a period of time. The current data for the particular wordline over the period of time may enable the controller 120 to determine health data associated with the particular wordline. The health data may indicate if and when the particular wordline is nearing an end-of-life (e.g., a failure). For example, the controller 120 may determine that the particular wordline is nearing the end-of-life based on an increase in the amount of current (flowing through the wordline during erase operations) over time. If the particular wordline fails, the controller 120 may have to decommission (e.g., no longer use) a particular block that includes the particular wordline. When the controller 120 identifies the particular wordline as nearing the end-of-life, the controller 120 may send the command 172 to the memory 104 to configure the memory 104 (e.g., one or more switches) to isolate the particular wordline during erase operations performed on the particular block. By avoiding performing erase operations on the wordline (e.g., a sub-block of the particular block that includes the particular wordline), a life of the particular wordline may be extended and endurance (e.g., usability) of the particular block may be increased.

The controller 120 may be configured to receive data and commands (e.g., instructions) from the host device 130 and may access the memory 104 based on the received commands. The controller 120 may send one or more write requests (e.g., a write command 128) to the memory 104 to store the data to a specified address of the memory 104. The write request may specify a physical address of a portion of the memory 104 (e.g., a physical address of a word line of the memory 104) that is to store the data. The controller 120 may be configured to send a read request to the memory 104 to access data from a specified address of the memory 104. To illustrate, the controller 120 may send a read request (e.g., a read command 126) to access the data stored in the memory 104. The read request may specify the physical address of a portion of the memory 104 (e.g., a physical address of a word line storing the data).

During operation, the memory die 103 (e.g., the erase circuitry 144) of the data storage device 102 may receive the command 172 from the controller 120. The command 172 may instruct the erase circuitry 144 to configure a block of the memory 104 to erase the second sub-block (e.g., the second set of wordlines) corresponding to the second portion 156 of the string 150.

Based on the command 172, the erase circuitry 144 may send the control signal 134 to the memory 104 to cause the switch 154 to decouple the first portion 152 and the second portion 156. When the first portion 152 and the second portion 156 are decoupled, the erase circuitry 144 may send the erase signal 136 to the memory 104. The erase signal 136 may cause an erase voltage to be applied the second portion 156 of the string 150, such as to the second sub-block. Based on the erase voltage applied to the second portion 156, data stored at the second set of storage elements corresponding to the second portion 156 (e.g., the second sub-block) may be erased, while data is maintained at the first set of storage elements corresponding to the first portion 152 (e.g., the first sub-block).

Although the tracking table 124 is illustrated as a single table, the tracking table 124 may include multiple tables. Additionally or alternatively, although the tracking table 124 is illustrated as being stored at the RAM 122 included in the controller 120, in other implementations at least a portion of the tracking table 124 may be stored at the memory 104, at a memory of the host device 130, at another memory that is coupled to the controller 120, or a combination thereof. Additionally or alternatively, the controller 120 may include a single memory component, such as the RAM 122, or may include multiple distinct memory components and/or multiple different types of memory components.

Additionally, the data storage device 102 may include an error correction code (ECC) engine (not shown). The ECC engine may be configured to receive data, such as the data 132, and to generate one or more error correction code (ECC) codewords (e.g., including a data portion and a parity portion) based on the data. For example, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may include a decoder configured to decode data read from the memory 104 to detect and correct bit errors that may be present in the data. For example, the ECC engine may correct a number of bit errors up to an error correction capability of an ECC technique used by the ECC engine. A number of errors identified by the ECC engine may be tracked by the controller 120, such as by the ECC engine. For example, based on the number of errors, the ECC engine may determine a bit error rate (BER) associated with one or more blocks of the memory 104 that may be used to determine when one or more portion of the memory 104 may be approaching an end-of-life condition.

By selectively isolating the first portion 152 and the second portion 156 using the switch 154, a partial block erase operation (e.g., a sub-block erase operation) may be performed on a block of a 3D memory that includes the string 150. The partial block erase operation may advantageously be performed more quickly and use less power than a full block erase operation. Additionally, by being able to perform the partial block erase operation, wordlines (of the block) that have been identified as nearing an end-of-life may be selectively isolated during erase operations to increase a life of the wordlines and a usefulness of blocks that include the wordlines.

Figure 2:
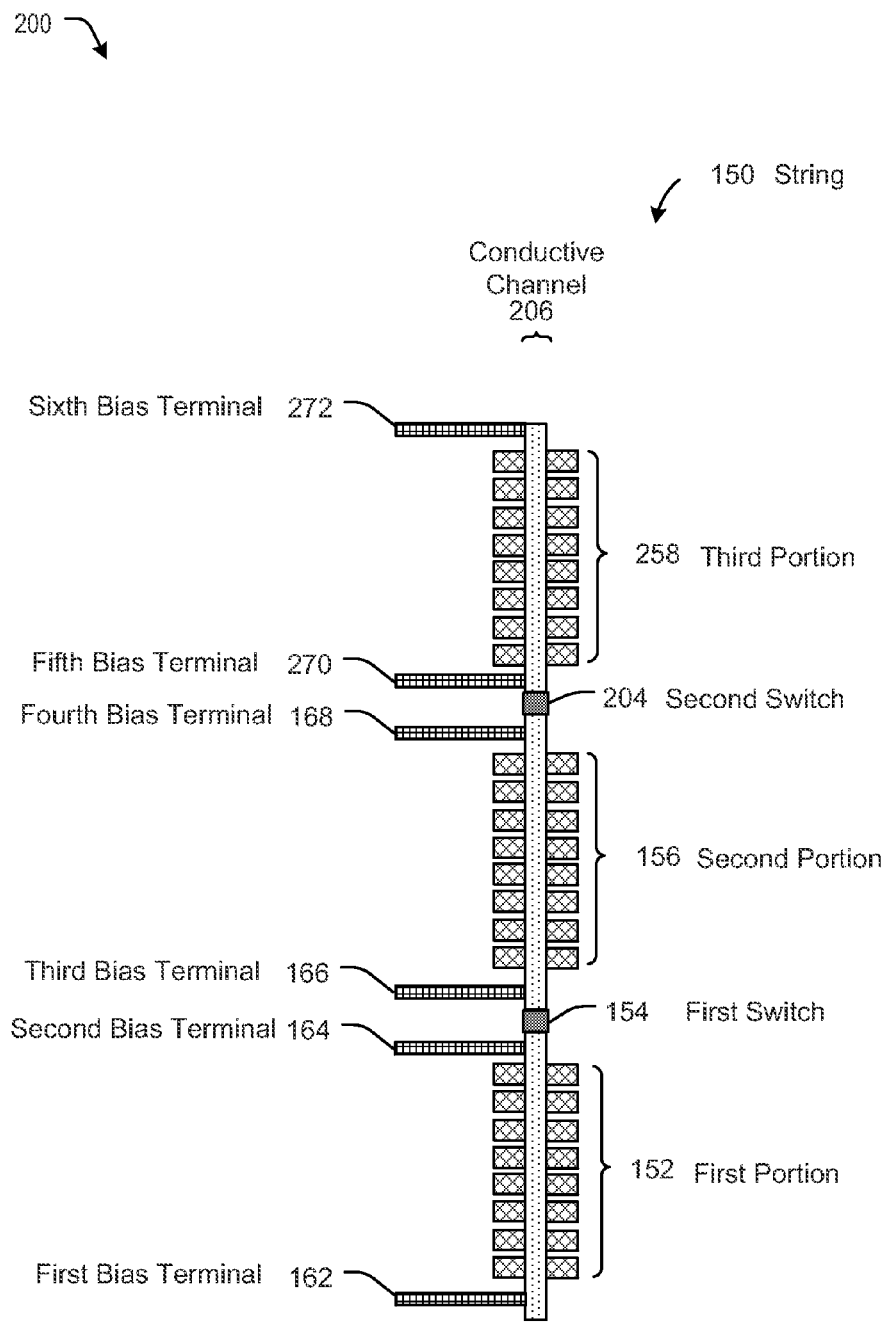
FIG. 2 illustrates an embodiment of the memory device of FIG. 1.

Referring to FIG. 2, a first example of a memory is illustrated and generally designated 200. The memory may include or correspond to the memory 104 of FIG. 1. The example 200 depicts a cross-sectional elevation view of the string 150.

The string 150 may include a conductive channel 206. The conductive channel 206 may include or correspond to the conductive channel 186 of FIG. 1. It is noted that one or more charge trap layers of the string 150 are not illustrated for clarity of illustration. The conductive channel 206 may include the first portion 152, the second portion 156, and a third portion 258. The first portion 152 may correspond to a first set of storage elements (e.g., one or more storage elements), the second portion 156 may correspond to a second set of storage elements (e.g., one or more storage elements), and the third portion 258 may correspond to a third set of storage elements (e.g., one or more storage elements). Although the string 150 is illustrated as including three portions, the string 150 may include more than three portions or fewer than three portions.

The string 150 may also include (or be coupled to) the switch 154 (e.g., a first switch) and a second switch 204. The first switch 154 may be configurable to couple or decouple the first portion 152 and the second portion 156. The second switch 204 may be configurable to couple or decouple the second portion 156 and the third portion 258. For example, the first switch 154 and/or the second switch 204 may be selectively configured based on one or more control signals, such as the control signal 134 of FIG. 1, received from the erase circuitry 144.

The string 150 may be coupled to one or more terminals (e.g., one or more bias terminals). For example, the one or more terminals may include the first bias terminal 162, the second bias terminal 164, the third bias terminal 166, the fourth bias terminal 168, a fifth bias terminal 270, and a sixth bias terminal 272. To illustrate, the first bias terminal 162 may be located at a first end of the first portion 152 and the second bias terminal 164 may be located at a second end of the first portion 152. The third bias terminal 166 may be located at a first end of the second portion 156 and the fourth bias terminal 168 may be located at a second end of the second portion 156. The fifth bias terminal 270 may be located at a first end of the third portion 258 and the sixth bias terminal 272 may be located at a second end of the third portion 258.

The first switch 154 and/or the second switch 204 may be selectively activated and/or deactivated to configure the string 150 for one or more erase operations. For example, the first switch 154 and the second switch 204 may couple and decouple one or more portions of the string 150 to configure the string 150 for a block erase operation or for sub-block erase operations.

To illustrate, prior to and during a first erase operation (corresponding to a first erase signal), the first switch 154 may be configured to decouple the first portion 152 and the second portion 156 and the second switch 204 may be configured to decouple the second portion 156 and the third portion 258. Accordingly, each portion of the string 150 may be isolated from the other portions of the string 150. The first erase operation may then be performed to erase a single sub-block, such as a single sub-block corresponding to the first portion 152, a single sub-block corresponding to the second portion 156, or a single sub-block corresponding to the third portion 258. To erase the sub-block corresponding to the first portion 152, a bias voltage (e.g., an erase voltage) may be applied to first bias terminal 162 and/or to the second bias terminal 164, but not to the third, fourth, fifth and sixth bias terminals 166-168, 270-272. To erase the sub-block corresponding to the second portion 156, a bias voltage (e.g., an erase voltage) may be applied to third bias terminal 166 and/or to the fourth bias terminal 168, but not to the first, second, fifth and sixth bias terminals 162-164, 270-272. To erase the sub-block corresponding to the third portion 258, a bias voltage (e.g., an erase voltage) may be applied to fifth bias terminal 270 and/or to the sixth bias terminal 272, but not to the first, second, third, and fourth bias terminals 162-168. It is also noted that a bias voltage (e.g., an erase voltage) may be concurrently applied to the first portion 152 and the third portion 258, but not applied to the second portion 156.

Prior to and during a second erase operation (corresponding to a second erase signal), the first switch 154 may be configured to couple the first portion 152 and the second portion 156 and the second switch 204 may be configured to couple the second portion 156 and the third portion 258. Accordingly, each portion of the string 150 may be coupled together. The second erase operation may then be performed to erase a block, such as a block corresponding to the string 150 (including each of the sub-blocks corresponding to the first portion 152, the second portion 156, and the third portion 258). To erase the block corresponding to the string 150, a bias voltage (e.g., an erase voltage) may be applied to one or more of the bias terminals 162-168, 270-272.

Prior to and during a third erase operation (corresponding to a third erase signal), the second switch 204 may be configured to couple the second portion 156 and the third portion 258. Additionally, prior to and during the third erase operation, the first switch 154 may be configured to decouple the first portion 152 and the second portion 156. The third erase operation may then be performed to erase multiple sub-blocks that include a sub-block corresponding to the second portion 156 and a sub-block corresponding to the third portion 258. To erase the multiple sub-blocks, a bias voltage (e.g., an erase voltage) may be applied to one or more of the third bias terminal 166, the fourth bias terminal 168, the fifth bias terminal 270, and the sixth bias terminal 272. It is also noted that when the second switch 204 is configured to couple the second portion 156 and the third portion 258 and the first switch is configured to decouple the first portion 152 and the second portion 156, an erase operation may be performed to erase a single sub-block corresponding to the first portion 152 without erasing data corresponding to the sub-blocks that correspond to the second portion 156 and the third portion 258.

Prior to and during a fourth erase operation (corresponding to a fourth erase signal), the second switch 204 may be configured to decouple the second portion 156 and the third portion 258. Additionally, prior to and during the fourth erase operation, the first switch 154 may be configured to couple the first portion 152 and the second portion 156. The fourth erase operation may then be performed to erase multiple sub-blocks that include a sub-block corresponding to the first portion 152 and a sub-block corresponding to the second portion 156. To erase the multiple sub-blocks, a bias voltage (e.g., an erase voltage) may be applied to one or more of the first bias terminal 162, the second bias terminal 164, third bias terminal 166, and the fourth bias terminal 168. It is also noted that when the second switch 204 is configured to decouple the second portion 156 and the third portion 258 and the first switch is configured to couple the first portion 152 and the second portion 156, an erase operation may be performed to erase a single sub-block corresponding to the third portion 258 without erasing data corresponding to the sub-blocks that correspond to the first portion 152 and the second portion 156.

By selectively configuring the first switch 154 and/or the second switch 204, an erase operation may be performed on less than an entire block (e.g., on one or more sub-blocks). By performing an erase operation on a sub-block of the 3D memory, rather than on an entire block, the erase operation may be performed more quickly and less power may be used.

Figure 3:
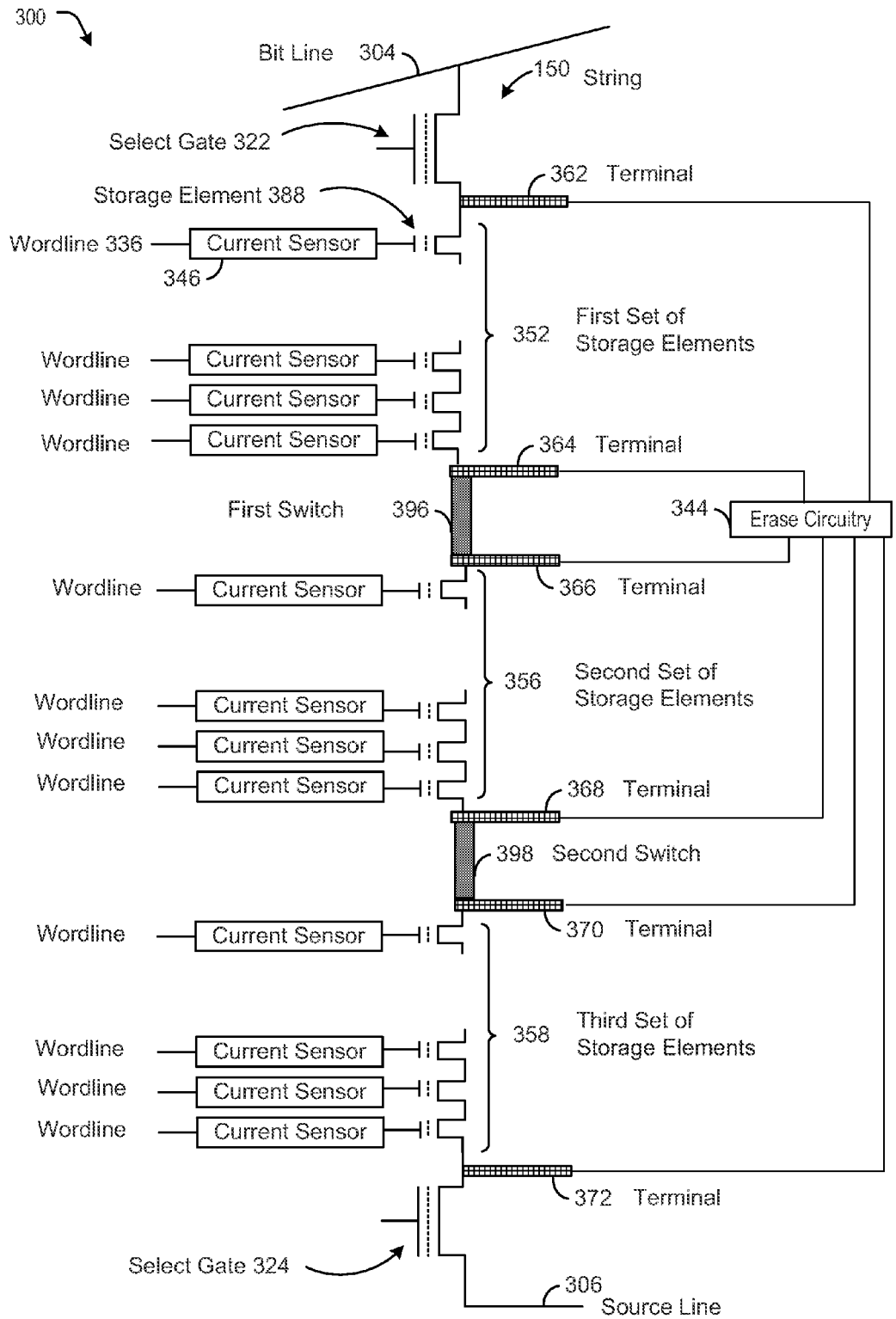
FIG. 3 illustrates another embodiment of the memory device of FIG. 1.

Referring to FIG. 3, a second example of a memory is illustrated and generally designated 300. The memory may include or correspond to the memory 104 of FIG. 1. The example 300 depicts a cross-sectional elevation view of the string 150.

The string 150 may include multiple sets of storage elements. For example, the string 150 may include a first set of storage elements 352, a second set of storage elements 356, and a third set of storage elements 358. The first set of storage elements 352 may correspond to a first portion of string 150, such as the first portion 152 of FIG. 1. The second set of storage elements 356 may correspond to a second portion of string 150, such as the second portion 156 of FIG. 1. The third set of storage elements 358 may correspond to a third portion of string 150, such as the third portion 258 of FIG. 2. Each set of storage elements 352, 356, 358 may be coupled to a conductive channel of the string 150, such as the conductive channel 186 of FIG. 1. Although FIG. 3 illustrates three sets of storage elements 352, 356, 358, the multiple sets of storage elements may include two sets of storage elements or more than three sets of storage elements.

The string 150 may be included in a block of the memory. Each of the multiple sets of storage elements 352, 356, 358 may correspond to a different sub-block of the block of the memory. Each of the sub-blocks may be erased independent of the other sub-blocks included in the block. Additionally, multiple sub-blocks may be erased during the same erase operation. For example, all of the sub-blocks or less than all of the sub-blocks may be erased during a single erase operation.

Each set of storage elements 352, 356, 358 may include multiple storage elements that are each coupled to a corresponding wordline. For example, a representative storage element 388 may be coupled to a wordline 336. To illustrate, the storage element 388 may include or correspond to the bit cell 174 of FIG. 1. Each wordline may be coupled to a corresponding current sensor. For example, each wordline may be coupled to a different current sensor. To illustrate, the wordline 336 may be coupled to a current sensor 346. Each current sensor may be configured to generate current sensor data, such as the current sensor data 126 of FIG. 1, during an erase operation performed on a corresponding wordline. The current sensor data may be provided to a controller, such as the controller 120 of FIG. 1, and/or a memory, such as the memory 104 or the RAM 122 of FIG. 1.

The multiple sets of storage elements 352, 356, 358 may be selectively coupled together by one or more switches, such as a first switch 396 and a second switch 398. The first switch 396 may include or correspond to the switch 154 of FIG. 1. The second switch 398 may include or correspond to the second switch 204 of FIG. 2. The first switch 396 and/or the second switch 398 may be configured to selectively couple one or more sets of storage element based on one or more control signals, such as the control signal 134 of FIG. 1.

The multiple sets of storage elements 352, 356, 358 may be coupled to a bit line 304 and to a source line 306. For example, the multiple sets of storage elements 352, 356, 358 may be coupled to the bit line 304 through a first select gate 322 (e.g., a first driver), and the multiple sets of storage elements 352, 356, 358 may be coupled to the source line 306 through a second select gate 324 (e.g., a second driver). To illustrate, the first select gate 322 may be between the bit line 304 and the first set of storage elements 352. The second select gate 324 may be between the third set of storage elements 358 and the source line 306.

One or more terminals 362-372 may be coupled to the string 150. The one or more terminals may include a first terminal 362, a second terminal 364, a third terminal 366, a fourth terminal 368, a fifth terminal 370, and a sixth terminal 372. The first terminal 362 may include or correspond to the first bias terminal 162 of FIG. 1, the second terminal 364 may include or correspond to the second bias terminal 164 of FIG. 1, the third terminal 366 may include or correspond to the third bias terminal 166 of FIG. 1, the fourth terminal 368 may include or correspond to the fourth bias terminal 168 of FIG. 1, the fifth terminal 370 may include or correspond to the fifth bias terminal 270 of FIG. 2, and the sixth terminal 372 may include or correspond to the sixth bias terminal 272 of FIG. 2. Although the string 150 is illustrated as being coupled to six terminals, the string 150 may be coupled to more than six terminals or fewer than six terminals.

Each of the terminals 362-372 may be coupled to erase circuitry 344. The erase circuitry 344 may include or correspond to the erase circuitry 144 of FIG. 1. The erase circuitry 344 may be configured to send one or more erase signals, such as the erase signal 136 of FIG. 1, to one or more of the terminals 362-372. The one or more erase signals may be used to apply a voltage (e.g., an erase voltage) to one or more terminals during an erase operation. Based on the configuration of the switches 396, 398, the erase voltage may be selectively applied to one or more portions of the string 150. For example, when the switches 396, 398 are in a first configuration (e.g., the first switch 396 is open and the first set of storage elements 352 is decoupled from the second set of storage elements 356, a first erase signal may be applied to the first terminal 362 and/or to the second terminal 364 to erase the first set of storage elements 352.

Figure 4:
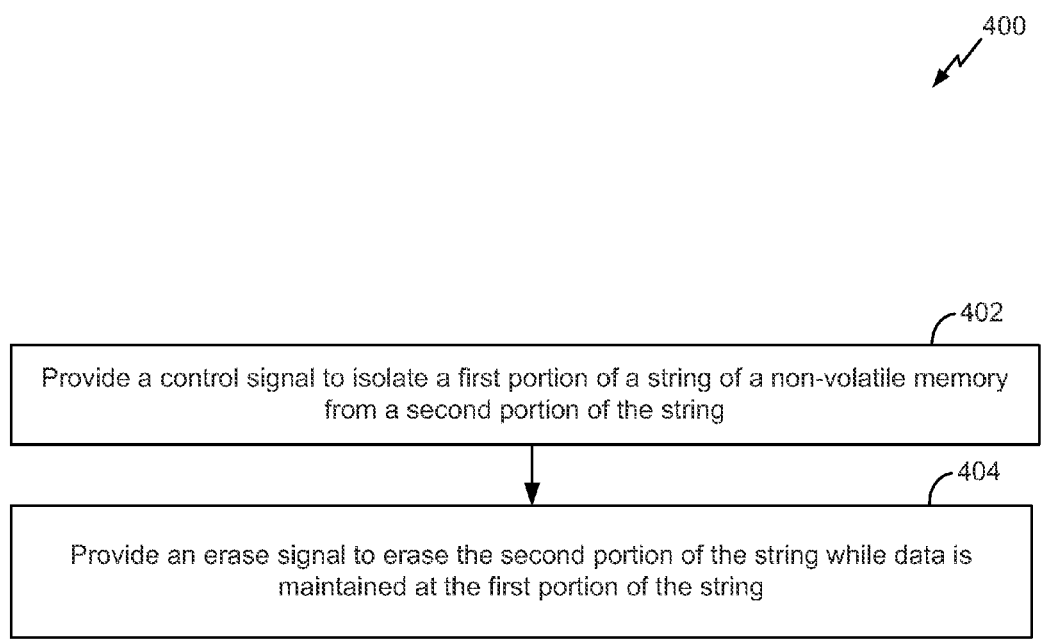
FIG. 4 is a flow diagram of an illustrative embodiment of a method to perform a partial block erase.

Referring to FIG. 4, an illustrative embodiment of a method 400 to enable a partial block erase of a three dimensional (3D) memory is shown. For example, the method 400 may be performed by at a data storage device, such as the data storage device 102 (e.g., the erase circuitry 144) of FIG. 1.

The method 400 includes providing a control signal to isolate a first portion of a string of a non-volatile memory from a second portion of the string, at 402. The non-volatile memory may be a 3D memory, such as the memory 104 of FIG. 1. The non-volatile memory may include at least one block that includes the string, such as the string 150. The string may include a first portion and a second portion. The first portion of the string may correspond to a first sub-block of the block and the second portion of the string may correspond to a second sub-block of the block. The control signal, such as the control signal 134 of FIG. 1, may be provided to a switch that is configurable to couple or decouple the first portion of the string to the second portion of the string. For example, the switch may include or correspond to the switch 154 of FIG. 1.

The method 400 further includes providing an erase signal to erase the second portion of the string while data is maintained at the first portion of the string, at 404. For example, the erase signal may include or correspond to the erase signal 136 of FIG. 1.

In some embodiments, providing the first erase signal may include applying a first voltage level on one or more wordlines corresponding to the second portion of the string. Alternatively or additionally, providing the first erase signal may include applying a second voltage level on a portion of a conductive channel of the string. The portion of the conductive channel corresponds to the second portion of the string. The first voltage level may be associated with a first voltage potential and the second voltage level may be associated with a second voltage potential, such that the first voltage potential and the second voltage potential are opposite potentials. To illustrate, the first voltage potential may be a positive voltage potential and the second voltage potential may be a negative voltage potential or a ground potential.

The method 400 may enable a partial block erase of the non-volatile memory (e.g., a 3D memory) by isolating the first portion of each of the strings in a block from the second portion of each of the strings. Accordingly, during an erase operation corresponding to the erase signal, first data may be maintained at the first portion of the string while second data may be erased from the second portion of the string.

The method 400 of FIG. 4 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 400 of FIG. 4 can be initiated or controlled by one or more processors, such as one or more processors included in or coupled to a controller. A controller configured to perform the method 400 of FIG. 4 may be able to perform a partial block erase (e.g., a sub-block erase) of a 3D memory.

Figure 5:
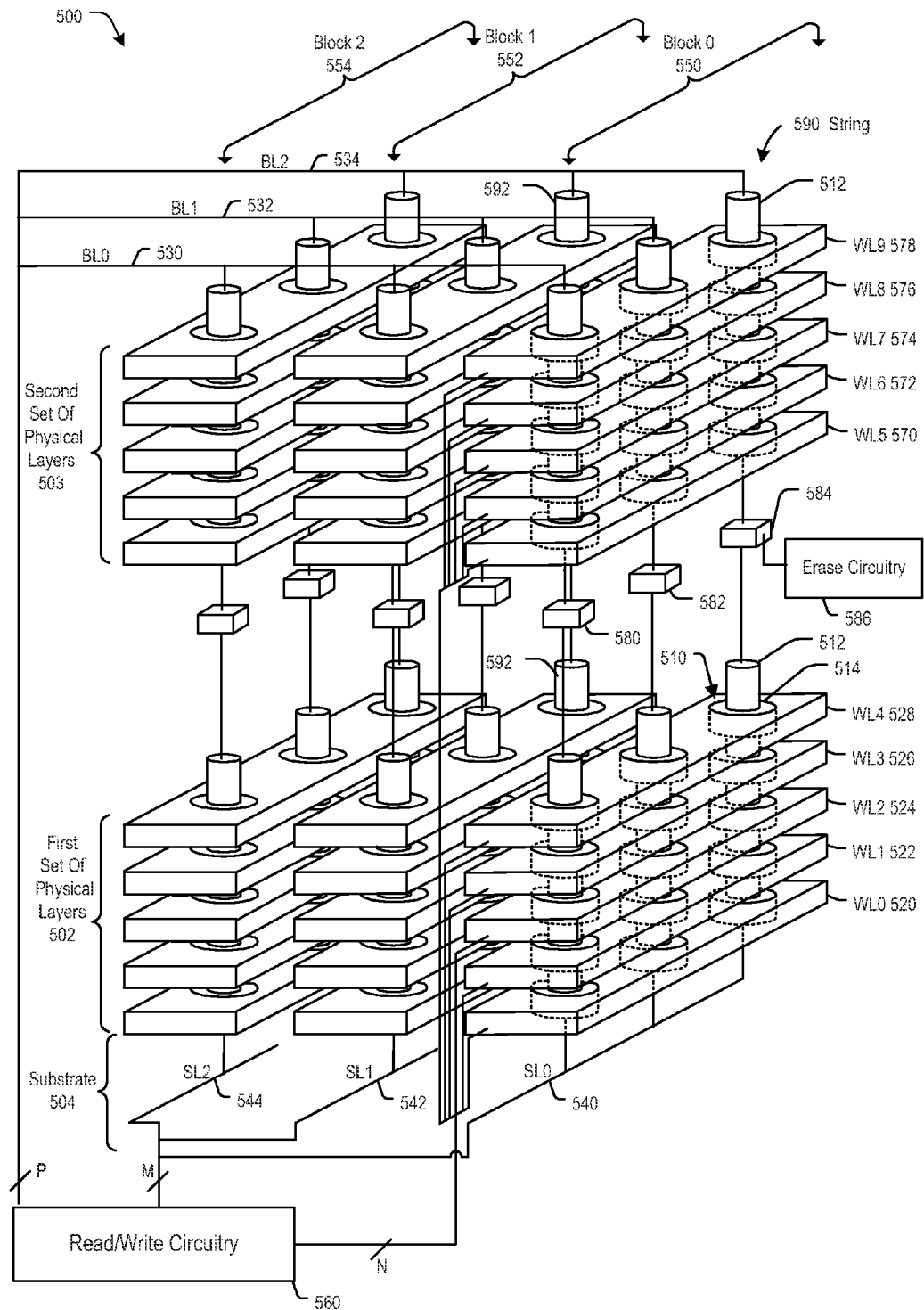
FIG. 5 is a block diagram of a particular embodiment of the non-volatile memory of one the data storage device of FIG. 1.

FIG. 5 illustrates an embodiment of a 3D memory 500 in a NAND flash configuration. The 3D memory 500 may correspond to the memory 104 of FIG. 1. The 3D memory 500 includes multiple physical layers, such as a first set of one or more physical layers 501 (e.g., a first set of physical levels) and a second set of one or more physical layers 503 (e.g., a second set of physical levels), that are monolithically formed above a substrate 504, such as a silicon substrate. Storage elements (e.g., memory cells), such as a representative memory cell 510, are arranged in arrays in the physical layers.

A representative string 590 may include the representative memory cell 510 and a conductive channel 512. The string 590 may include or correspond to the string 150 of FIG. 1. The representative memory cell 510 includes a charge trap structure 514 between a wordline/control gate (WL4) 528 and the conductive channel 512. The charge trap may include or correspond to the first charge trap layer 170 or the second charge trap layer 176 of FIG. 1. Charge may be injected into or drained from the charge trap structure 514 via biasing of the conductive channel 512 relative to the wordline 528. For example, the charge trap structure 514 may include silicon nitride and may be separated from the wordline 528 and the conductive channel 512 by a gate dielectric, such as a silicon oxide. An amount of charge in the charge trap structure 514 affects an amount of current through the conductive channel 512 during a read operation of the memory cell 510 and indicates one or more bit values that are stored in the memory cell 510. The conductive channel 512 may include or correspond to the conductive channel 186 of FIG. 1.

The 3D memory 500 includes multiple erase blocks, including a first block (block 0) 550, a second block (block 1) 552, and a third block (block 2) 554. Each block 550-554 includes a "vertical slice" of the physical layers 502 that includes a stack of wordlines, illustrated as a first wordline (WL0) 520, a second wordline (WL1) 522, a third wordline (WL2) 524, a fourth wordline (WL3) 526, a fifth wordline (WL4) 528, a sixth wordline (WL5) 570, a seventh wordline (WL6) 572, an eighth wordline (WL7) 574, a ninth wordline (WL8) 576, and a tenth wordline (WL9) 578. Multiple conductive channels (having a substantially vertical orientation with respect to FIG. 5) extend through the stack of wordlines. Each conductive channel may be associated with a different string, such as a NAND string. Each conductive channel is coupled to a storage element in each wordline 520-528, 570-578, forming a NAND string of storage elements. FIG. 5 illustrates three blocks 550-554, ten wordlines 520-528, 570-578 in each block, and three conductive channels in each block for clarity of illustration. However, the 3D memory 500 may have more than three blocks, more than ten wordlines per block, and more than three conductive channels per block.

Read/write circuitry 560 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 504) and a first source line (SL0) 540, a second source line (SL1) 542, and a third source line (SL2) 544) at a "bottom" end of the conductive channels (e.g., nearer to or within the substrate 504). The read/write circuitry 560 is illustrated as coupled to the bit lines 530-534 via "P" control lines, coupled to the source lines 540-744 via "M" control lines, and coupled to the wordlines 520-528 via "N" control lines. Each of P, M, and N may have a positive integer value based on the specific configuration of the 3D memory 500. In the illustrative example of FIGS. 5, P=3, M=3, and N=10.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

Each of the conductive channels (e.g., each string) may be coupled to one or more corresponding switches, such as representative switches 580-584. The representative switch 584 may be configurable to couple and/or decouple a first portion of the string 590 (corresponding to the first set of physical layers 502) and a second portion of the string 590 (corresponding to the second set of physical layers 503). The switch 584 may include or correspond to the switch 154 of FIG. 1, the switch 204 of FIG. 2, and/or the switches 396, 398 of FIG. 3. Each of the switches may be coupled to erase circuitry 586. As illustrated in FIG. 5, only the switch 584 is depicted as being coupled to the erase circuitry 586 for clarity of illustration. The erase circuitry 586 may operate as described with respect to the erase circuitry 144 of FIG. 1 and/or the erase circuitry 344 of FIG. 3. FIG. 5 does not illustrate terminals (e.g., bias terminals) coupled to each of the conductive channels for clarity of illustration. It is understood that the 3D memory 500 may include one or more terminals coupled to each of the conductive channels, as described with reference to the terminals 162-186 of FIG. 1, the terminals 270-272 of FIG. 2, and/or the terminals 362-372 of FIG. 3.

The read/write circuitry 560 may operate as described with respect to the read circuitry 140 and/or the write circuitry 142 of FIG. 1. For example, data may be stored to storage elements coupled to the wordline 528 and the read/write circuitry 560 may read bit values from the storage elements. As another example, the read/write circuitry 560 may apply selection signals to control lines coupled to the wordlines 520-528, the bit lines 530-534, and the source lines 540-542 to cause a programming voltage (e.g., a voltage pulse or series of voltage pulses) to be applied across selected storage element(s) of the selected wordline (e.g., the fourth wordline 528).

During a read operation, the controller 120 may receive a request from a host device, such as the host device 130 of FIG. 1. The controller 120 may cause the read/write circuitry 560 to read bits from particular storage elements of the 3D memory 500 by applying appropriate signals to the control lines to cause storage elements of a selected wordline to be sensed. Accordingly, the 3D memory 500 having multiple conductive channels in a stacked configuration may be configured to read from and write data to one or more storage elements.

During an erase operation, such as a partial block erase operation, a block of the memory 500 to be erased may be identified. For example, the first block (block 0) 550 may be identified to have a first portion (e.g., a sub-block) of the first block (block 0) 550 erased. The first portion of the first block (block 0) 550 may correspond to the wordlines 520-528 that are associated with the first set of physical layers 502. The erase circuitry 586 may send one or more control signals to disable the switches 580-584. Accordingly, the first portion of the first block (block 0) 550 (e.g., a first portion of each of the strings included in the first block (block 0) 550) may be isolated from a second portion (e.g., a second sub-block) of the first block (block 0) 550 that corresponds to the second set of physical layers 503. An erase voltage may be applied to the first portion of the first block (block 0) 550 to erase the first sub-block. For example, the erase voltage may be applied to a first portion of each of the strings included in the first block (block 0) 550.

Figure 6:
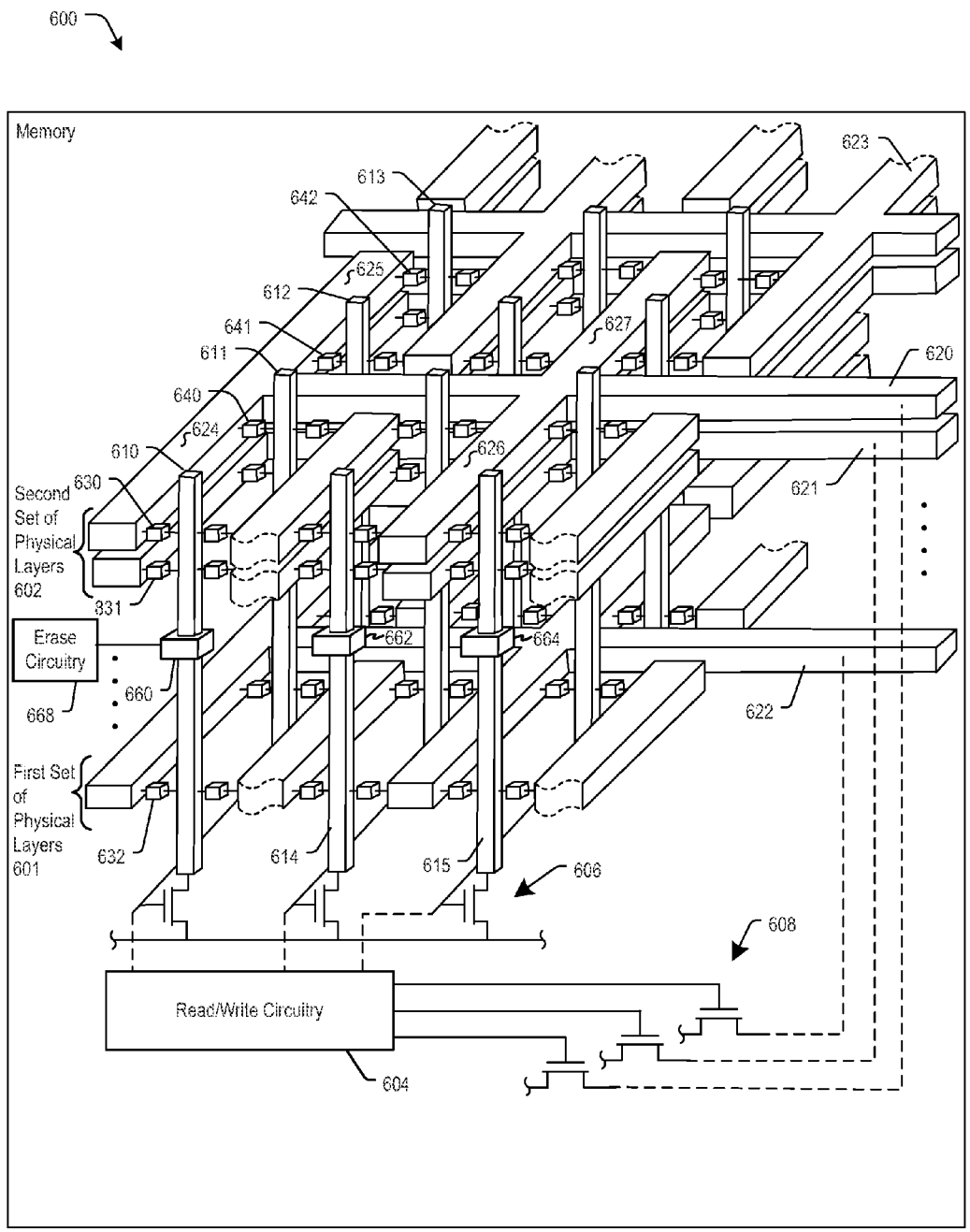
FIG. 6 is a block diagram of another particular embodiment of the non-volatile memory of the data storage device of FIG. 1.

FIG. 6 is a diagram of a particular embodiment of a memory 600. The memory 600 may be included in the data storage device 102 of FIG. 1. FIG. 6 illustrates a portion of a three dimensional architecture of the memory 600, such as the memory 104. In the embodiment illustrated in FIG. 6, the memory 600 is a vertical bit line Resistive Random Access Memory (ReRAM) with a plurality of conductive lines in physical layers over a substrate (e.g., substantially parallel to a surface of the substrate), such as representative wordlines 620, 621, 622, and 623 (only a portion of which is shown in FIG. 6) and a plurality of vertical conductive lines through the physical layers, such as representative bit lines 610, 611, 612, and 613. The wordline 622 may include or correspond to a first set of one or more physical layers 601 and the wordlines 620, 621 may include or correspond to a second set of one or more of physical layers 602.

The memory 600 also includes a plurality of resistance-based storage elements (e.g., memory cells), such as representative storage elements 630, 631, 632, 640, 641, and 642, each of which is coupled to a bit line and a wordline in arrays of memory cells in multiple physical layers over the substrate (e.g., a silicon substrate). The memory 600 also includes read/write circuitry 604, such as the read circuitry 140 and/or the write circuitry 142 of FIG. 1. The read/write circuitry 604 is coupled to wordline drivers 608 and bit line drivers 606.

In the embodiment illustrated in FIG. 6, each of the wordlines includes a plurality of fingers (e.g., a first wordline 620 includes fingers 624, 625, 626, and 627). Each finger may be coupled to more than one bit line. To illustrate, a first finger 624 of the first wordline 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one wordline. To illustrate, the first bit line 610 is coupled to the first wordline 620 via the first storage element 630 and is coupled to a third wordline 622 via a third storage element 632.

In the embodiment illustrated in FIG. 6, each bit line, such as the representative bit lines 610, 611, 612, and 613, may be coupled to one or more corresponding switches, such as representative switches 660-664. The representative switch 660 may be configurable to couple and/or decouple a first portion of the bit line 610 (corresponding to the first set of physical layers 601) and a second portion of the bit line 610 (corresponding to the second set of physical layers 602). The switch 660 may include or correspond to the switch 154 of FIG. 1, the switch 204 of FIG. 2, the switches 396, 398 of FIG. 3, and/or the switches 580-584 of FIG. 5. Each of the switches may be coupled to erase circuitry 668. As illustrated in FIG. 6, only the switch 660 is depicted as being coupled to the erase circuitry 668 for clarity of illustration. The erase circuitry 668 may operate as described with respect to the erase circuitry 144 of FIG. 1, the erase circuitry 344 of FIG. 3, and/or the erase circuitry 586 of FIG. 5. FIG. 6 does not illustrate terminals (e.g., bias terminals) coupled to each of the bit lines for clarity of illustration. It is understood that the memory 600 may include one or more terminals coupled to each of the conductive channels, as described with reference to the terminals 162-186 of FIG. 1, the terminals 270-272 of FIG. 2, and/or the terminals 362-372 of FIG. 3.

During a write operation, the controller 120 may receive data from a host device, such as the host device 130 of FIG. 1. The controller 120 may send the data (or a representation of the data) to the memory 600. For example, the controller 120 may encode the data prior to sending the encoded data to the memory 600.

The read/write circuitry 604 may write the data to storage elements corresponding to the destination of the data. For example, the read/write circuitry 604 may apply selection signals to selection control lines coupled to the wordline drivers 608 and the bit line drivers 606 to cause a write voltage to be applied across a selected storage element. For example, to select the first storage element 630, the read/write circuitry 604 may activate the wordline drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to wordlines other than the first wordline 620 and applying a second voltage to the first wordline 620. In a particular embodiment, the first voltage is applied to other bit lines (e.g., the bit lines 614, 615) to reduce leakage current in the memory 600.

During a read operation, the controller 120 may receive a request from a host device, such as the host device 130 of FIG. 1. The controller 120 may cause the read/write circuitry 604 to read bits from particular storage elements of the memory 600 by applying selection signals to selection control lines coupled to the wordline drivers 608 and the bit line drivers 606 to cause a read voltage to be applied across a selected storage element. For example, to select the first storage element 630, the read/write circuitry 604 may activate the wordline drivers 608 and the bit line drivers 606 to apply a first voltage (e.g., 0.7 volts (V)) to the first bit line 610 and to wordlines other than the first wordline 620. A lower voltage (e.g., 0 V) may be applied to the first wordline 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120. Accordingly, each of the bit lines 610, 611, 612, and 613 may include multiple portions and the multiple portions of a particular bit line may be in a stacked configuration.

Although various components of the data storage device 102 and the host device 130 depicted herein are illustrated as block components and described in general terms, such components may include one or more microprocessors, state machines, or other circuits configured to enable the controller 120 and/or the memory (e.g., the read circuitry 140, the write circuitry 142, and/or the erase circuitry 144) of FIG. 1 to perform operations described herein. One or more aspects of the controller 120 and/or the memory 104 (e.g., the read circuitry 140, the write circuitry 142, and/or the erase circuitry 144) of FIG. 1 may be implemented using a microprocessor or microcontroller programmed to perform operations described herein, such as one or more operations of method 400 of FIG. 4. In a particular embodiment, the controller 120 and/or the memory (e.g., the read circuitry 140, the write circuitry 142, and/or the erase circuitry 144) of FIG. 1 includes a processor executing instructions that are stored at a memory, such as a non-volatile memory of the data storage device 102 or the host device 130. Alternatively or additionally, executable instructions that are executed by the processor may be stored at a separate memory location that is not part of the non-volatile memory, such as at a read-only memory (ROM) of the data storage device 102 or the host device 130.

In an illustrative example, the processor may execute the instructions to provide a control signal to isolate a first portion of a string of a memory from a second portion of the string. The instructions to provide the control signal may include instructions to receive a command (e.g., an erase command) from a controller, instructions to identify one or more switches included in a memory (e.g., a 3D memory) to be enabled, instructions to identify one or more switches included in the memory to be disabled, instructions to identify a block of the memory to be erased, instructions to determine whether to initiate a full block erase operation or a partial block erase operation, and/or instructions to identify one or more sub-blocks to be erased, as illustrative, non-limiting examples. The processor may execute instructions to provide an erase signal to erase the second portion of the string while data is maintained at the first portion of the string. The instructions to provide the erase signal may include instructions to send the erase signal to the memory, instructions to identify one or more terminals to receive an erase voltage, instructions to identify one or more wordlines to be erased, and/or instructions to determine a current value for each wordline erased during an erase operation corresponding to the erase signal, as illustrative, non-limiting examples.

The data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

Semiconductor memory devices, such as the memory 104 and/or the RAM 122 include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 and/or the RAM 122 is a non-volatile memory having a three dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 may include circuitry, such as read circuitry, write circuitry, and/or erase circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a non-volatile memory having a three dimensional (3D) memory configuration that is monolithically formed in one or more physical levels of arrays of memory cells having an active area disposed above a silicon substrate, the non-volatile memory including circuitry associated with operation of the memory cells, wherein the non-volatile memory comprises:
a string including a plurality of storage elements, wherein the string includes a first portion and a second portion; and
a switch coupled to the string, wherein the switch is configurable to isolate the first portion of the string from the second portion of the string based on a control signal.

2. The data storage device of claim 1, wherein the switch comprises a metal-oxide semiconductor (MOS) transistor.

3. The data storage device of claim 1, further comprising erase circuitry configured, when the first portion is isolated from the second portion, to perform a first erase operation on the second portion of the string to erase data at the second portion while maintaining data at the first portion of the string.

4. The data storage device of claim 1, wherein a first bias terminal is located at a first end of the first portion, and wherein a second bias terminal is located at a second end of the first portion.

5. The data storage device of claim 4, wherein a third bias terminal is located at a first end of the second portion, and wherein a fourth bias terminal is located at a second end of the second portion.

6. The data storage device of claim 1, further comprising a controller coupled to the non-volatile memory, wherein the controller is configured to determine whether to enable the switch to couple the first portion and the second portion or to disable the switch to decouple the first portion from the second portion.

7. The data storage device of claim 6, wherein each storage element of the plurality of storage elements corresponds to a wordline, and wherein each wordline is coupled to a different current sensor.

8. The data storage device of claim 7, wherein, during an erase operation to erase a particular wordline, a particular current sensor corresponding to the particular wordline determines an amount of current through the particular wordline, and wherein an indication of the amount of current is provided to a controller.

9. A data storage device comprising:
a non-volatile memory comprising a string including a plurality of storage elements, wherein the string includes a first portion and a second portion; and
a controller configured to generate control signals, wherein the control signals include a first control signal to cause the first portion to be coupled to the second portion and a second control signal to cause the first portion to be decoupled from the second portion.

10. The data storage device of claim 9, wherein the non-volatile memory further comprises a switch coupled to the string, wherein the switch is configurable to electrically couple the first portion and the second portion of the string responsive to the first control signal, and wherein the switch is configurable to isolate the first portion from the second portion of the string responsive to the second control signal.

11. The data storage device of claim 10, wherein the switch comprises a metal-oxide semiconductor (MOS) transistor.

12. The data storage device of claim 10, wherein each storage element of the plurality of storage elements corresponds to a wordline, and wherein each wordline is coupled to a different current sensor.

13. The data storage device of claim 10, wherein the non-volatile memory has a three dimensional (3D) memory configuration that is monolithically formed in one or more physical levels disposed above a silicon substrate.

14. An apparatus comprising:
a non-volatile memory having a three dimensional (3D) memory configuration that is monolithically formed in one or more physical levels above a silicon substrate, wherein the non-volatile memory comprises:
means for providing a first control signal to isolate a first portion of a string of the non-volatile memory from a second portion of the string; and
means for providing a first erase signal to erase the second portion of the string while data is maintained at the first portion of the string.

15. The apparatus of claim 14, wherein the string includes a third portion.

16. The apparatus of claim 15, wherein the apparatus further comprises:
first means for coupling and decoupling the first portion of the string to the second portion of the string; and
second means for coupling and decoupling the second portion of the string to a third portion of the string.

17. The apparatus of claim 14, wherein the first portion is included in a first physical level of the one or more physical levels, and wherein the second portion is included in a second physical level of the one or more physical levels.

18. The apparatus of claim 14, wherein the first portion includes a first set of one or more storage elements, and wherein the second portion includes a second set of one or more storage elements.

19. The apparatus of claim 18, wherein the first set of one or more storage elements and the second set of one or more storage elements include the same number of storage elements.

20. The apparatus of claim 18, wherein the first set of one or more storage elements includes a single storage element.

* * * * *